(12) United States Patent
Liu et al.

(10) Patent No.: US 12,324,169 B2
(45) Date of Patent: Jun. 3, 2025

(54) SUBSTRATE INTEGRATED WITH PASSIVE DEVICE AND METHOD FOR MANUFACTURING THE SAME

(71) Applicant: BOE TECHNOLOGY GROUP CO., LTD., Beijing (CN)

(72) Inventors: Yingwei Liu, Beijing (CN); Zhanfeng Cao, Beijing (CN); Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/641,135

(22) PCT Filed: Apr. 23, 2021

(86) PCT No.: PCT/CN2021/089141
§ 371 (c)(1),
(2) Date: Mar. 8, 2022

(87) PCT Pub. No.: WO2022/222124
PCT Pub. Date: Oct. 27, 2022

(65) Prior Publication Data
US 2024/0047507 A1 Feb. 8, 2024

(51) Int. Cl.
*H01L 23/522* (2006.01)
*H01L 23/66* (2006.01)
(Continued)

(52) U.S. Cl.
CPC ......... *H10D 1/20* (2025.01); *H01L 23/5227* (2013.01); *H01L 23/66* (2013.01); *H10D 1/692* (2025.01); *H01L 2223/6672* (2013.01)

(58) Field of Classification Search
CPC ... H01L 23/66; H01L 23/522; H01L 23/5227; H01L 28/10; H01L 28/80;
(Continued)

(56) References Cited

U.S. PATENT DOCUMENTS

2016/0163450 A1* 6/2016 Berdy ................ H01F 17/0013
29/605
2016/0181211 A1* 6/2016 Kamgaing ............. H01L 23/66
257/621
2019/0132942 A1 5/2019 Yun et al.

FOREIGN PATENT DOCUMENTS

CN 104919702 A 9/2015
CN 105308862 A 2/2016
(Continued)

*Primary Examiner* — Chuong A Luu
(74) *Attorney, Agent, or Firm* — HOUTTEMAN LAW LLC

(57) ABSTRACT

The present disclosure provides a substrate integrated with a passive device and a method for manufacturing the same. The method includes: providing and processing a transparent dielectric layer to obtain the transparent dielectric layer provided with a first connection via therein, with the transparent dielectric layer including a first surface and a second surface which are disposed oppositely; and integrating a passive device, which includes at least an inductor, on the transparent dielectric layer. The integrating a passive device on the transparent dielectric layer includes: forming a first sub-structure on the first surface of the transparent dielectric layer, forming a second sub-structure on the second surface of the transparent dielectric layer, and forming a first connection electrode in the first connection via; and the first sub-structure, the first connection electrode and the second sub-structure are connected to form a coil structure of the inductor.

16 Claims, 8 Drawing Sheets

(51) Int. Cl.
  *H10D 1/20* (2025.01)
  *H10D 1/68* (2025.01)
(58) Field of Classification Search
  CPC .... H01L 2223/6672; H10D 1/20; H10D 1/68; H10D 1/692; H03F 17/00; H03H 7/01
  USPC ........................................................ 257/531
  See application file for complete search history.

(56) References Cited

FOREIGN PATENT DOCUMENTS

| | | |
|---|---|---|
| CN | 106409758 A | 2/2017 |
| CN | 108476014 A | 8/2018 |
| CN | 111817677 A | 10/2020 |

\* cited by examiner

SUBSTRATE INTEGRATED WITH PASSIVE DEVICE AND METHOD FOR MANUFACTURING THE SAME

TECHNICAL FIELD

The present disclosure belongs to the technical field of radio frequency devices, and particularly relates to a substrate integrated with a passive device and a method for manufacturing the substrate.

BACKGROUND

Nowadays, consumer electronics industry is developing rapidly, so are mobile communication terminals represented by mobile phones, especially 5G mobile phones. Frequency bands of signals to be processed by the mobile phones have become more and more, resulting in an increase in the number of radio frequency chips required, but the mobile phones which are popular among consumers are continuously developing towards miniaturization, lightness, thinness and long battery life. In a traditional mobile phone, a large number of discrete devices such as resistors, capacitors, inductors and filters exist on a radio frequency Printed Circuit Board (PCB), and the discrete devices can hardly meet future requirements due to their disadvantages of large volume, high power consumption, multiple solder joints and large variation of parasitic parameters. Interconnection and matching between the radio frequency chips require integrated passive devices with small area, high performance and good consistency. The integrated passive devices currently on the market are mainly based on silicon (Si) substrates and gallium arsenide (GaAs) substrates. The Si-based integrated passive devices are cheap, but have relatively high microwave loss and ordinary performance because Si contains a trace of impurities (which cause poor insulation); while the GaAs-based integrated passive devices have good performance, but are expensive.

SUMMARY

The present disclosure aims to solve at least one of the technical problems in the prior art, and provides a substrate integrated with a passive device and a method for manufacturing the substrate.

In a first aspect, embodiments of the present disclosure provide a method for manufacturing a substrate integrated with a passive device, including:
providing and processing a transparent dielectric layer to obtain the transparent dielectric layer provided with a first connection via therein, with the transparent dielectric layer including a first surface and a second surface which are oppositely disposed along a thickness direction of the transparent dielectric layer; and
integrating a passive device, which includes at least an inductor, on the transparent dielectric layer;
where the integrating a passive device on the transparent dielectric layer includes:
forming a first sub-structure on the first surface of the transparent dielectric layer,
forming a second sub-structure on the second surface of the transparent dielectric layer,
and forming a first connection electrode in the first connection via; and the first sub-structure, the first connection electrode and the second sub-structure are connected to form a coil structure of the inductor.

In some implementations, the method includes:
providing the transparent dielectric layer, and etching the transparent dielectric layer to form a first blind hole;
forming the first connection electrode in the first blind hole and the first sub-structure by a patterning process;
performing a thinning process on a side of the transparent dielectric layer away from the first sub-structure to expose the first connection electrode and form the first connection via; and
forming a pattern including the second sub-structure on the second surface of the transparent dielectric layer; and the second sub-structure, the first connection electrode and the first sub-structure are connected to form the coil structure of the inductor.

In some implementations, the providing the transparent dielectric layer and etching the transparent dielectric layer to form a first blind hole includes: performing laser modification and hydrofluoric acid (HF) etching on the transparent dielectric layer, to form the first blind hole.

In some implementations, the forming the first connection electrode in the first blind hole and the first sub-structure by a patterning process includes:
forming a first metal material on the transparent dielectric layer provided with the first blind hole, and electroplating the first metal material to form a first metal film layer; and sequentially forming a first protective layer and a first planarization layer on a side of the first metal film layer away from the transparent dielectric layer, and forming a pattern including the first connection electrode and the first sub-structure by a patterning process.

In some implementations, the method includes:
providing a first base substrate, and attaching the transparent dielectric layer, which is provided with the first connection via, to the first base substrate;
depositing a first metal material on the first surface and the second surface of the transparent dielectric layer respectively, and performing an electroplating process to allow the first metal material to cover at least a sidewall of the first connection via and form a first metal film layer on the first surface;
patterning the first metal film layer to form a pattern including the first sub-structure; and
forming a pattern including the second sub-structure on the second surface of the transparent dielectric layer; and the second sub-structure, the first connection electrode and the first sub-structure are connected to form the coil structure of the inductor.

In some implementations, the providing a first base substrate and attaching the transparent dielectric layer to the first base substrate includes:
performing laser modification on the first surface and the second surface of the transparent dielectric layer respectively, and performing HF etching to form the first connection via.

In some implementations, the first metal film layer covers a sidewall of the first connection via, and before forming the first metal film layer, the method further includes:
forming a first planarization layer on a side of the first metal material away from the transparent dielectric layer so as to fill the first connection via with the first planarization layer.

In some implementations, after forming the first sub-structure, the method further includes:
sequentially forming a second protective layer and a second planarization layer on a side of the first sub-structure away from the transparent dielectric layer.

In some implementations, the passive device includes a capacitor; a first electrode plate of the capacitor is further formed on the second surface with the second sub-structure being formed on the second surface; and the method further includes: forming a first interlayer dielectric layer on a side of the first electrode plate of the capacitor away from the transparent dielectric layer;

forming a second electrode plate of the capacitor on a side of the first interlayer dielectric layer away from the transparent dielectric layer;

forming a second interlayer dielectric layer on a side of the second electrode plate of the capacitor away from the transparent dielectric layer, and forming a second connection via penetrating through the first interlayer dielectric layer and the second interlayer dielectric layer, and a third connection via penetrating through the second interlayer dielectric layer; and forming a pattern including a second connection electrode and a connection pad by a patterning process on a side of the second interlayer dielectric layer away from the transparent dielectric layer; and the second connection electrode connects the second sub-structure to the second electrode plate of the capacitor through the second connection via and the third connection via.

In some implementations, a first buffer layer and a third planarization layer are sequentially deposited on a side of a layer, where the second connection electrode and the connection pad are located, away from the transparent dielectric layer, and a fourth connection via penetrating through the first buffer layer and the third planarization layer is formed, and exposes the connection pad.

In some implementations, the transparent dielectric layer includes a glass base.

The embodiments of the present disclosure provide a substrate integrated with a passive device, including: a transparent dielectric layer and the passive device integrated on the transparent dielectric layer;

where the transparent dielectric layer includes a first surface and a second surface, which are disposed oppositely along a thickness direction of the transparent dielectric layer; and the transparent dielectric layer is provided with a first connection via penetrating through the transparent dielectric layer along the thickness direction of the transparent dielectric layer; and the passive device includes at least an inductor; the inductor includes a first sub-structure on the first surface, a second sub-structure on the second surface, and a first connection electrode in the first connection via for sequentially connecting the first sub-electrode with the second sub-structure in series.

In some implementations, the passive device further includes a capacitor; a first electrode plate of the capacitor and the second sub-structure of the inductor are in a same layer; the substrate further includes a first interlayer dielectric layer on a side of the first electrode plate of the capacitor away from the transparent dielectric layer; and a second electrode plate of the capacitor is on a side of the first interlayer dielectric layer away from the first electrode plate of the capacitor.

In some implementations, the transparent dielectric layer includes a glass base.

DETAIL DESCRIPTION OF EMBODIMENTS

In order to enable those of ordinary skill in the art to better understand the technical solutions of the present disclosure, the present disclosure is further described in detail below with reference to the accompanying drawings and specific implementations.

Unless otherwise defined, technical terms or scientific terms used herein should have general meanings that are understood by those of ordinary skill in the technical field to which the present disclosure belongs. The words "first", "second" and the like used herein do not denote any order, quantity or importance, but are just used to distinguish between different elements. Similarly, the words "an", "a", "the" and the like do not denote a limitation to quantity, and indicate the existence of "at least one" instead. The words "include", "comprise" and the like indicate that an element or object before the words covers or contains the elements or objects or the equivalents thereof listed after the words, rather than excluding other elements or objects. The words "connect", "couple" and the like are not limited to physical or mechanical connection, but may also indicate electrical connection, whether direct or indirect. The words "on", "under", "left", "right" and the like are only used to indicate relative positional relationships. When an absolute position of an object described is changed, the relative positional relationships may be changed accordingly.

The embodiments of the present disclosure provide a substrate integrated with a passive device and a method for manufacturing the substrate. Passive devices, such as a capacitor, an inductor and a resistor, are integrated on the substrate to form a circuit structure. The embodiments of the present disclosure are described by taking a case where an LC oscillator circuit is integrated on the substrate as an example. That is, at least an inductor and a capacitor are integrated on the substrate. It should be understood that a resistor and the like may further be integrated on the substrate according to functions and performances of the circuit.

Figure 1:
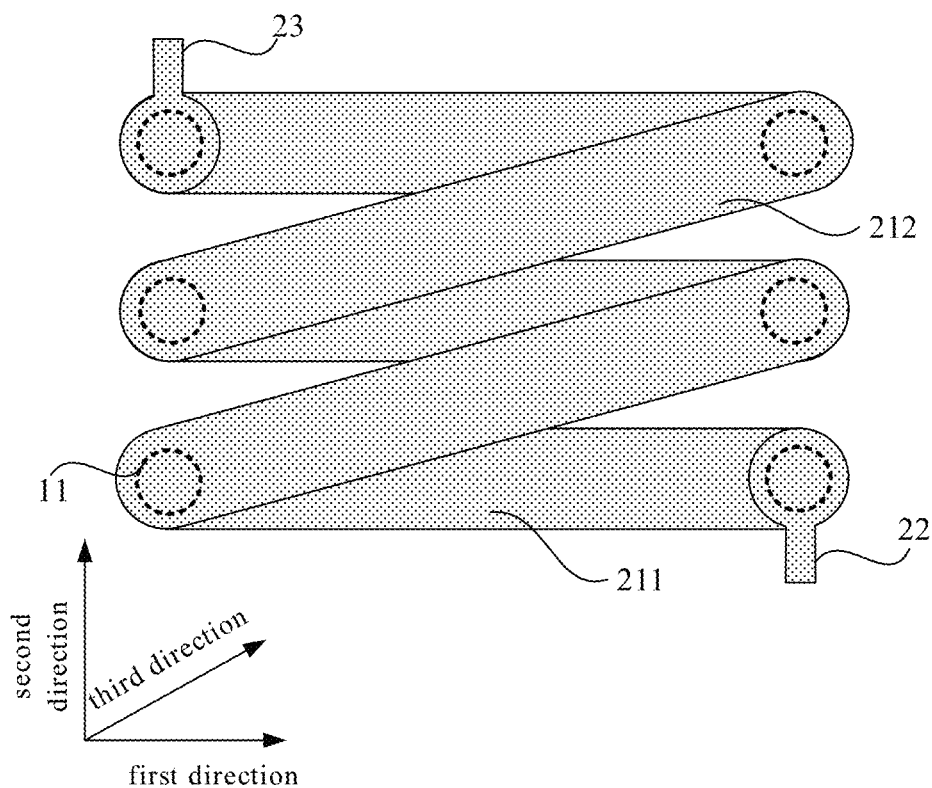
FIG. 1 is a top view of an inductor according to the embodiments of the present disclosure.

FIG. 1 is a top view of an inductor according to the embodiments of the present disclosure. With reference to FIG. 1, first sub-structures 211 of the inductor each extend along a first direction and are arranged side by side along a second direction; and second sub-structures 212 of the inductor each extend along a third direction and are arranged side by side along the second direction. The first direction, the second direction and the third direction are different from each other, and a case where the first direction and the second direction are perpendicular to each other and the first direction and the third direction intersect but are not perpendicular to each other is taken as an example in the embodiments of the present disclosure. Apparently, the direction in which each of the first sub-structures 211 extends and the direction in which each of the second sub-structures 212 extends may be interchanged, which also falls within the scope of the embodiments of the present disclosure. In addition, the embodiments of the present disclosure are described by taking a case where the inductor includes N first sub-structures 211 and N−1 second sub-structures 212 as an example, where N≥2 and N is an integer. An orthographic projection of each of a first end and a second end of each first sub-structure 211 on a glass base 10 at least partially overlaps an orthographic projection of one first connection via 11 on the glass base 10. The first end and the second end of each of the first sub-structures 211 correspond to different first connection vias 11, respectively, that is, an orthographic projection of each of the first sub-structures 211 on the glass base 10 at least partially overlaps orthographic projections of two first connection vias 11 on the glass base 10. In such case, the $i^{th}$ second sub-structure 212 of the inductor is connected to the first end of the $i^{th}$ first sub-structure 211 and the second end of the $(i+1)^{th}$ first sub-structure 211 to form a coil of the inductor, where 1<<i<<N−1, and i is an integer.

It should be noted that a first lead terminal 22 is connected to the second end of a first one of the first sub-structures 211 of the inductor, and a second lead terminal 23 is connected to the first end of the $N^{th}$ first sub-structure 211. Further, the first lead terminal 22, the second lead terminal 23 and the second sub-structures 212 may be disposed in a same layer and made of a same material, in such case, the first lead terminal 22 may be connected to the second end of the first one of the first sub-structures 211 through the first connection via 11, and correspondingly, the second lead terminal 23 may be connected to the first end of the $N^{th}$ first sub-structure 211 through the first connection via 11.

Figure 2:
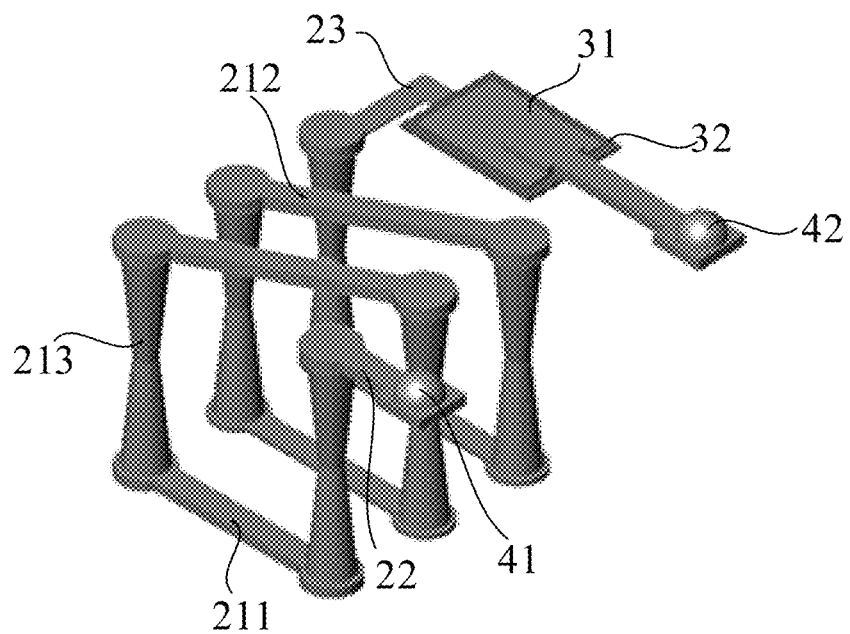
FIG. 2 is a schematic diagram of a three-dimensional structure of an LC oscillator circuit according to the embodiments of the present disclosure.

FIG. 2 is a schematic diagram of a three-dimensional structure of an LC oscillator circuit according to the embodiments of the present disclosure. As shown in FIG. 2, the LC oscillator circuit includes the inductor and a capacitor 3; the inductor includes the first sub-structures 211, the second sub-structures 212, and first connection electrodes 213; and opposite ends of each of the first connection electrodes 213 are respectively provided with one of the first sub-structures 211 and one of the second sub-structures 212, and each of the first connection electrodes 213 connects the first sub-structure 211 with the second sub-structure 212 at the opposite ends thereof, thereby forming a coil, with a three-dimensional structure, of the inductor (hereinafter, the coil of the inductor may also be referred to as an induction coil). With reference to FIG. 2, the first lead terminal 22 of the induction coil is connected to a first connection pad 41, the second lead terminal 23 of the induction coil is connected to a first electrode plate 31 of the capacitor 3, a second electrode plate 32 of the capacitor 3 is connected to a second connection pad 42, and the first connection pad 41 and the second connection pad 42 are respectively connected to a positive pole and a negative pole of a current source or a voltage source.

Figure 3:
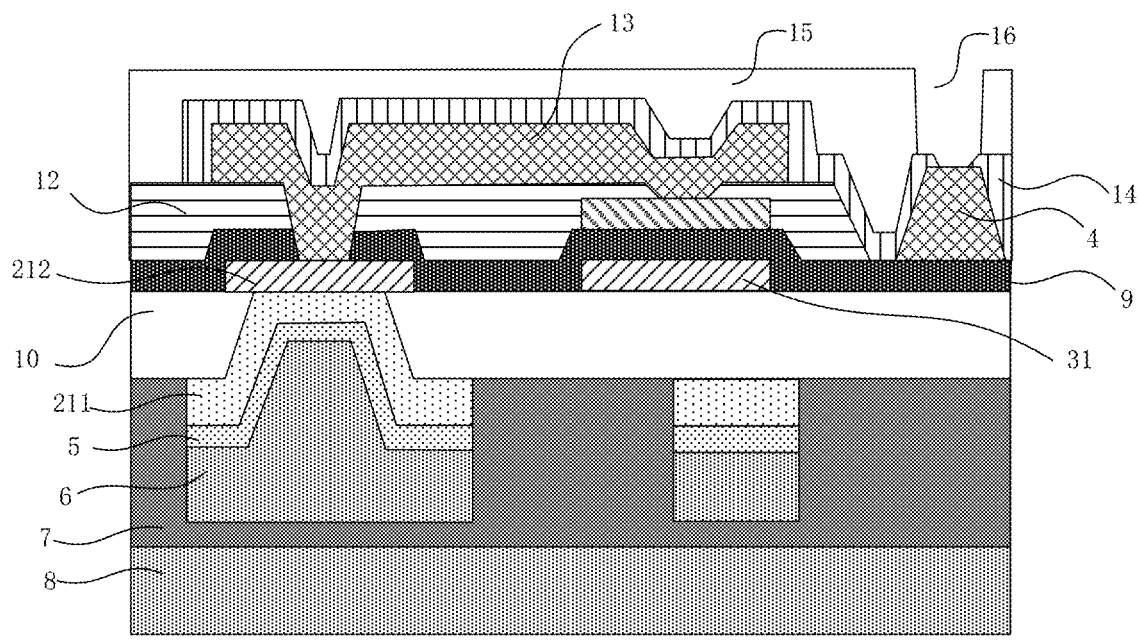
FIG. 3 is a sectional view of a substrate integrated with a passive device according to the embodiments of the present disclosure.

FIG. 3 is a sectional view of a substrate integrated with a passive device according to the embodiments of the present disclosure. As shown in FIG. 3, in the embodiments of the present disclosure, the LC oscillator circuit is integrated on a transparent dielectric layer, the transparent dielectric layer includes a first surface and a second surface which are oppositely disposed along a thickness direction of the transparent dielectric layer (i.e., a direction in which a thickness of the transparent dielectric layer is taken), and the transparent dielectric layer is provided with the first connection vias 11 penetrating through the transparent dielectric layer along the thickness direction of the transparent dielectric layer; and the first connection electrodes 213 of the induction coil are formed in the first connection vias 11, the first sub-structures 211 of the induction coil are formed on the first surface of the transparent dielectric layer, and the second sub-structures 212 of the induction coil are formed on the second surface of the transparent dielectric layer.

In some implementations, the transparent dielectric layer in the embodiments of the present disclosure includes, but is not limited to, any one of the glass base 10, a flexible substrate, and an interlayer dielectric layer including at least an organic insulating layer. Since integrating the passive devices on the glass base 10 can result in the advantages such as small volume, light weight, high performance and low power consumption, it is desired to adopt the glass base 10 as the transparent dielectric layer in the embodiments of the present disclosure. The description below is given by taking a case where the glass base 10 is adopted as the transparent dielectric layer as an example.

With reference to FIG. 3, the first electrode plate 31 of the capacitor 3 is disposed on the second surface of the glass base 10 and in a layer the same as that where the second sub-structures 212 of the induction coil are located, a first interlayer dielectric layer 9 is disposed on a side of the first electrode plate 31 of the capacitor 3 away from the glass base 10, and the second electrode plate 32 of the capacitor 3 is disposed on a side of the first interlayer dielectric layer 9 away from the first electrode plate 31 of the capacitor 3; a second interlayer dielectric layer 12 is disposed on a side of the second electrode plate 32 of the capacitor 3 away from the glass base 10, and a second connection electrode 13 and a connection pad 4 are disposed on a side of the second interlayer dielectric layer 12 away from the glass base 10; and the second connection electrode 13 connects the second lead terminal of the induction coil to the second electrode plate 32 of the capacitor 3 through a second connection via 121 penetrating through the first interlayer dielectric layer 9 and the second interlayer dielectric layer 12 and a third connection via 122 penetrating through the second interlayer dielectric layer 12. The connection pad 4 is connected to the first electrode plate 31 of the capacitor 3.

With reference to FIG. 3, a second protective layer 7 and a second planarization layer 8 may be formed on a side of the first sub-structures 211 away from the glass base 10 to protect the first sub-structures 211 against water and oxygen. Correspondingly, a first buffer layer 14 and a third planarization layer 15 may be further formed on a side of the second connection electrode 13 and the connection pad 4 away from the glass base 10 to protect the connection electrodes, the second sub-structures 212, the capacitor 3 and the like. It should be noted that a fourth connection via 16 penetrating through the first buffer layer 14 and the third planarization layer 15 is formed at a position corresponding to the connection pad 4 for loading of signals.

Structural parameters of each device on the substrate integrated with a passive device according to the embodiments of the present disclosure are described one by one in the method described below, and thus are not described in detail here.

The embodiments of the present disclosure provide a method for manufacturing a substrate integrated with a passive device, the substrate may be the substrate described above, and the method includes the following steps:
    providing and processing the glass base 10 to obtain the glass base 10 provided with the first connection vias 11, with the glass base 10 including the first surface and the second surface which are oppositely disposed along the thickness direction of the glass base 10; and
    integrating a passive device, which includes at least an inductor, on the glass base 10.

In some implementations, the integrating a passive device on the glass base 10 includes:
    forming the first sub-structures 211 on the first surface of the glass base 10, forming the second sub-structures 212 on the second surface of the glass base 10, and forming the first connection electrodes 213 in the first connection vias 11, with the first sub-structures 211, the first connection electrodes 213 and the second sub-structures 212 being connected to form the induction coil.

In order to clarify the method in the embodiments of the present disclosure, the method for manufacturing a substrate integrated with a passive device in the embodiments of the present disclosure is described below with reference to the drawings and specific implementations.

In a first implementation, the method for manufacturing a substrate integrated with a passive device includes the following steps S11 to S19.

Figure 4A:
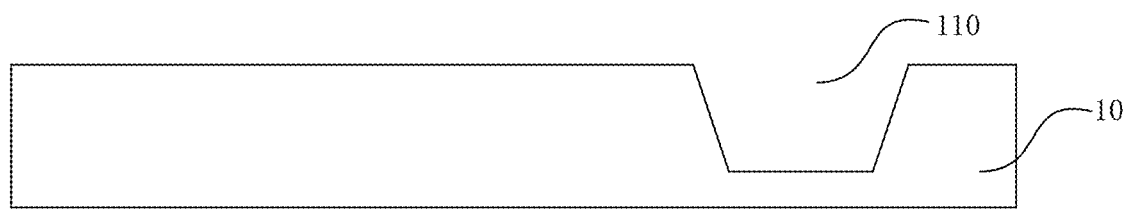
FIG. 4a is a schematic diagram of a structure formed by step S11 of a method for manufacturing a substrate integrated with a passive device according to the embodiments of the present disclosure.

At S11, a transparent dielectric layer is provided and etched to form a first blind hole, as shown in FIG. 4a.

In some examples, the step S11 may specifically include the following steps (1) to (3).

(1) Cleaning: the glass base 10 is cleaned in a cleaning machine.

In some examples, the glass base 10 has a thickness of about 0.1 mm to 1.1 mm.

(2) Laser drilling: a laser is used to irradiate a laser beam vertically into the first surface of the glass base 10 to perform laser modification on the first surface, so as to form a plurality of first blind holes 110 in the glass base 10. Specifically, when the laser beam interacts with the glass base 10, atoms in the glass base 10 are ionized and ejected out of the surface of the glass base 10 due to relatively high energy of laser photons, so that the hole drilled becomes deeper and deeper with time until the first blind holes are formed. In general, laser wavelengths of 532 nm, 355 nm, 266 nm, 248 nm, and 197 nm may be selected, laser pulse widths ranging from ifs to 100 fs, from 1 ps to 100 ps, and from ins to 100 ns may be selected, and a type of the laser may be a continuous wave laser, a pulse laser or the like. The method of drilling the holes by the laser may include, but is not limited to, the following two modes. In a first mode, a diameter of a laser spot is relatively large, relative positions of the laser beam and the glass base 10 are fixed, and the holes with a preset depth are directly drilled in the glass base 10 due to the high energy of the laser beam, in such case, the first blind holes formed each are in a shape of inverted frustum (i.e., inverted circular truncated cone), and a diameter of the inverted frustum sequential decreases from top to bottom (along a direction from the second surface towards the first surface). In a second mode, the diameter of the laser spot is relatively small, the laser beam scans the glass base 10 in a manner of drawing circles, a focus of the laser spot is continuously changed, a focal depth of the focus is also continuously changed, and a spiral line is drawn from a lower surface (the first surface) of the glass base 10 towards an upper surface (the second surface) of the glass base 10, and a radius of the spiral line sequentially decreases from bottom to top, so that the glass base 10 is cut by the laser to form the first blind holes in a shape of frustum.

(3) Hydrofluoric acid (HF) etching: in the laser drilling process, since a stress area ranging from about 5 microns to about 20 microns may be formed in a region of an upper surface of the glass base 10 close to the first blind hole and in a region of an inner wall of the first blind hole, the surface of the glass base 10 in the stress area may be uneven and molten and has a plurality of burrs, and a large number of microcracks and macrocracks, and residual stress exist in the stress area, wet etching is carried out for a certain time duration by using an HF etching solution with a concentration ranging from 2% to 20% at a proper temperature, to remove a certain amount of glass in the stress area, so as to smoothen the surface of the glass base 10 in a region close to the first blind hole and the inner wall of the first blind hole, eliminate the microcracks and the macrocracks, and remove the stress area completely.

At S12, the first connection electrode 213 in the first blind hole and the first sub-structure 211 are formed by a patterning process.

In some examples, the step S12 may specifically include the following steps (1) to (5).

Figure 4B:
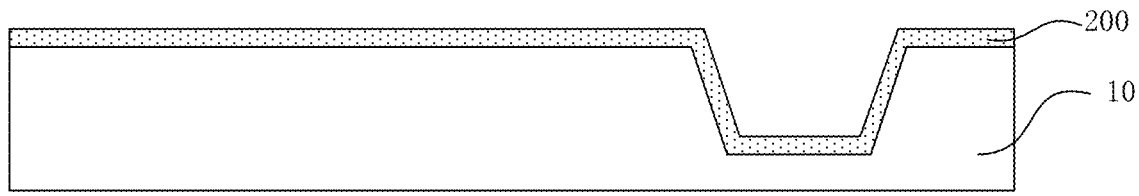
FIG. 4b is a schematic diagram of a structure formed by (1) of step S12 of a method for manufacturing a substrate integrated with a passive device according to the embodiments of the present disclosure.

(1) Growing of a seed layer: a first metal material 200 is formed on the first surface of the glass base 10 by means of magnetron sputtering and serves as the seed layer, as shown in FIG. 4*b*.

In some examples, the first metal material 200 includes, but is not limited to, at least one of copper (Cu), aluminum (Al), molybdenum (Mo) or silver (Ag), and forms a first metal film layer 201, a thickness of the first metal film layer 201 ranges from about 100 nm to about 500 nm, and may range from about 50 nm to about 35 m. In the following description, a case where a material of the first metal film layer 201 is copper is taken as an example.

In some examples, in order to increase adhesion between the first metal material 200 and the first surface of the glass base 10, an auxiliary metal film layer may be formed on the first surface of the glass base 10 in a manner including, but not limited to, magnetron sputtering, before the first metal material 200 is formed. A material of the auxiliary metal film layer includes, but is not limited to, at least one of nickel (Ni), molybdenum (Mo) alloy or titanium (Ti) alloy, for example, the auxiliary metal film layer may be made of MoNb, and the auxiliary metal film layer may have a thickness ranging from about 2 nm to about 20 nm.

Figure 4C:
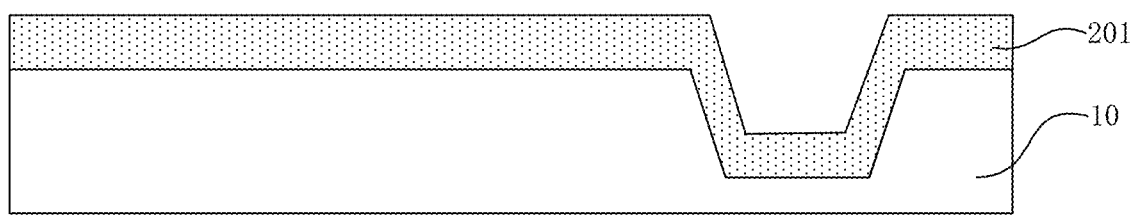
FIG. 4c is a schematic diagram of a structure formed by (2) of step S12 of a method for manufacturing a substrate integrated with a passive device according to the embodiments of the present disclosure.

(2) Electroplating: the glass base 10 is placed on a carrier of an electroplating machine, pressed by a powered pad, and placed in a hole-filling electroplating bath (containing a dedicated hole-filling electrolyte), a current is applied to keep electroplating solution to flow on the first surface of the glass base 10 continuously and rapidly, and cations in the electroplating solution near the inner wall of the first blind hole acquire electrons to form atoms to be deposited on the inner wall; and by using the dedicated hole-filling electrolyte with special proportion, copper can be mainly deposited in the first blind hole at a high speed (a deposition speed ranging from 0.5 um/min to 3 um/min), while the first surface of the glass base 10 is relatively flat, and the deposition speed of copper on such surface is extremely low (ranging from 0.005 um/min to 0.05 um/min). The copper on the inner wall of the first blind hole becomes more and more thicker with time so as to form the first metal film layer 201, which outgrows the first metal material 200 by more than 5 m, as shown in FIG. 4*c*.

Figure 4D:
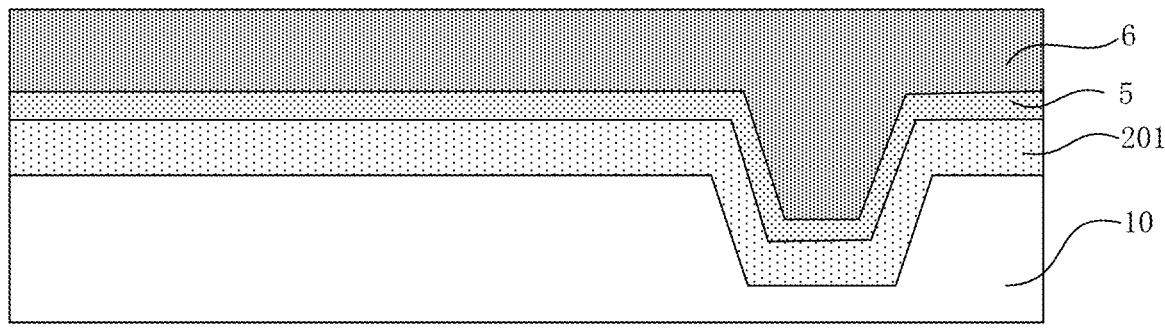
FIG. 4d is a schematic diagram of a structure formed by (3) and (4) of step S12 of a method for manufacturing a substrate integrated with a passive device according to the embodiments of the present disclosure.

(3) Formation of a protective layer: a first protective layer 5 is formed on a side of the first metal film layer 201 away from the glass base 10, as shown in FIG. 4*d*. The first protective layer 5 is made of an inorganic insulating material. For example, the first protective layer 5 may be an inorganic insulating layer made of silicon nitride (SiNx), or an inorganic insulating layer made of silicon oxide (e.g., $SiO_2$), or a laminated film of several inorganic insulating layers of SiNx and inorganic insulating layers of $SiO_2$.

(4) Formation of a first planarization layer 6: the first planarization layer 6 is formed on a surface of the first protective layer 5 away from the glass base 10, as shown in FIG. 4*d*. The first planarization layer 6 may be made of an organic insulating material, for example, the organic insulating material includes polyimide, epoxy resin, acrylic, polyester, photoresist, polyacrylate, polyamide, siloxane and other resin materials. As another example, the organic insulating material includes an elastic material, such as urethane, and Thermoplastic Polyurethane (TPU).

Figure 4E:
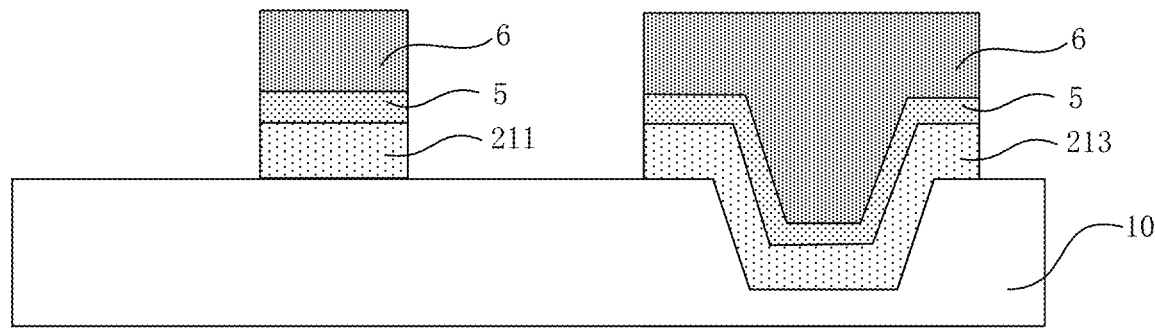
FIG. 4e is a schematic diagram of a structure formed by (5) of step S12 of a method for manufacturing a substrate integrated with a passive device according to the embodiments of the present disclosure.

(5) Patterning of layers on the first surface: the first planarization layer 6 on the first surface is exposed and developed, and then is etched, and a photoresist is stripped off after the etching, so that the first protective layer 5, the first planarization layer 6 and the first metal film layer 201 on the first surface are patterned to form the first sub-structure 211 of the induction coil on the first surface and the first connection electrode 213, as shown in FIG. 4*e*.

Figure 4F:
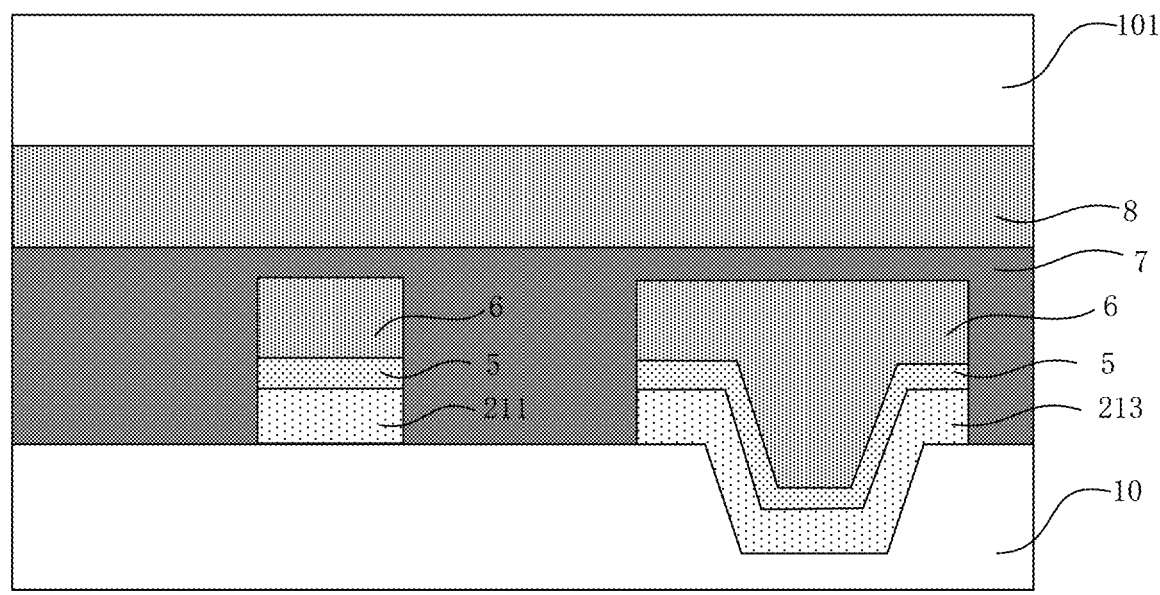
FIG. 4f is a schematic diagram of a structure formed by step S13 of a method for manufacturing a substrate integrated with a passive device according to the embodiments of the present disclosure.

At S13, the second protective layer 7 and the second planarization layer 8 are sequentially formed on a side of the first planarization layer 6 away from the glass base 10, as shown in FIG. 4*f*. The second protective layer 7 and the first protective layer 5 may be made of a same material, which is not repeated here. The second planarization layer 8 and the first planarization layer 6 may be made of a same material, which is not repeated here.

Figure 4G:
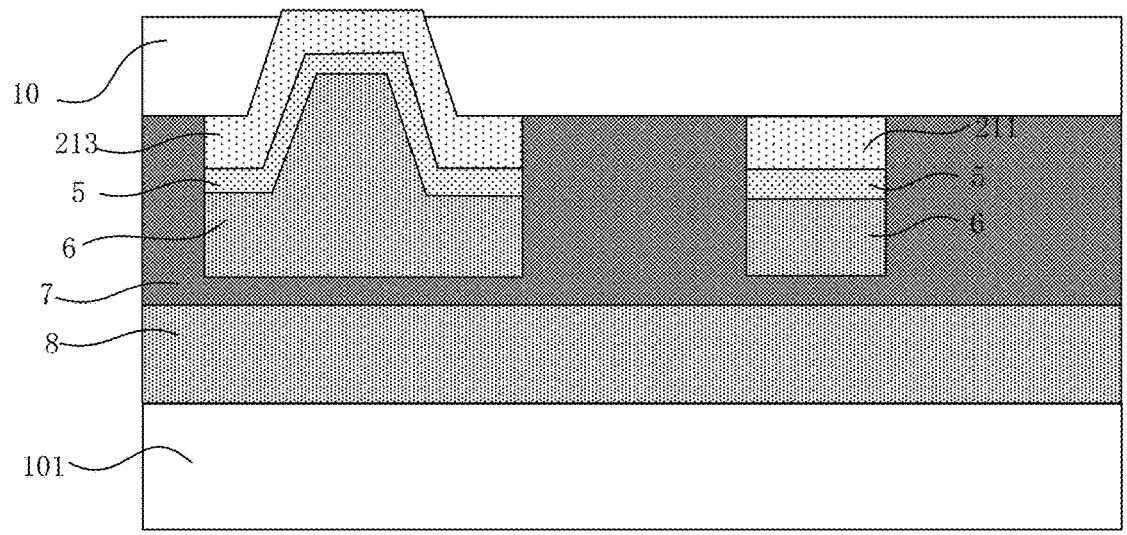
FIG. 4g is a schematic diagram of a structure formed by step S14 of a method for manufacturing a substrate integrated with a passive device according to the embodiments of the present disclosure.

At S14, the first planarization layer 6 and a first base substrate 101 are bonded together, the glass base 10 is turned over, a thinning process is performed on a side of the glass base 10 away from the first sub-structure 211 to expose the first connection electrode 213, and form the first connection via 11, as shown in FIG. 4*g*.

Figure 4H:
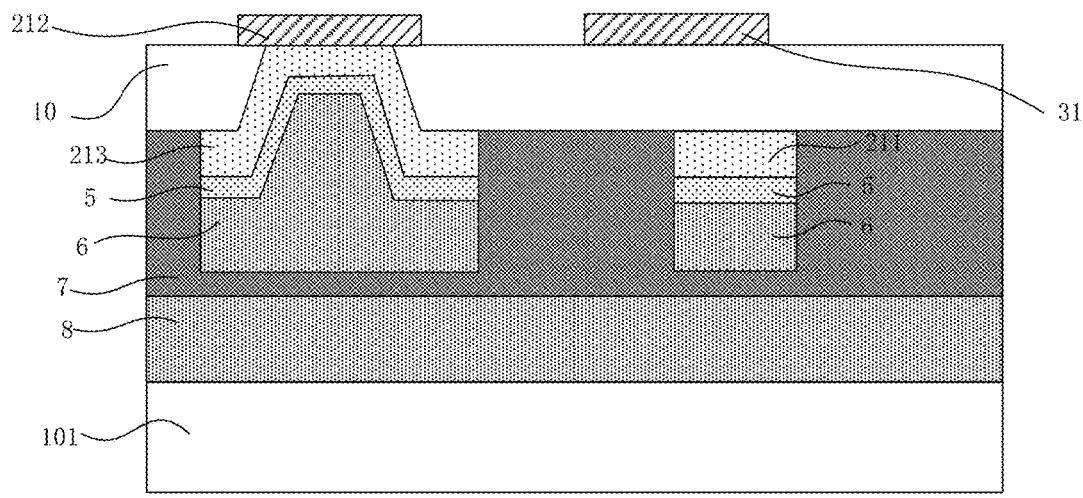
FIG. 4h is a schematic diagram of a structure formed by step S15 of a method for manufacturing a substrate integrated with a passive device according to the embodiments of the present disclosure.

At S15, a pattern including the second sub-structure 212 of the induction coil and the first electrode plate 31 of the capacitor 3 is formed by a patterning process on the second surface of the glass base 10, as shown in FIG. 4*h*.

In some examples, the step S15 may specifically include forming a second metal film layer in a manner including, but not limited to, magnetron sputtering, applying a photoresist, exposing, developing, performing wet etching, and stripping off the photoresist to form the pattern including the second sub-structure 212 of the induction coil and the first electrode plate 31 of the capacitor 3.

Figure 4I:
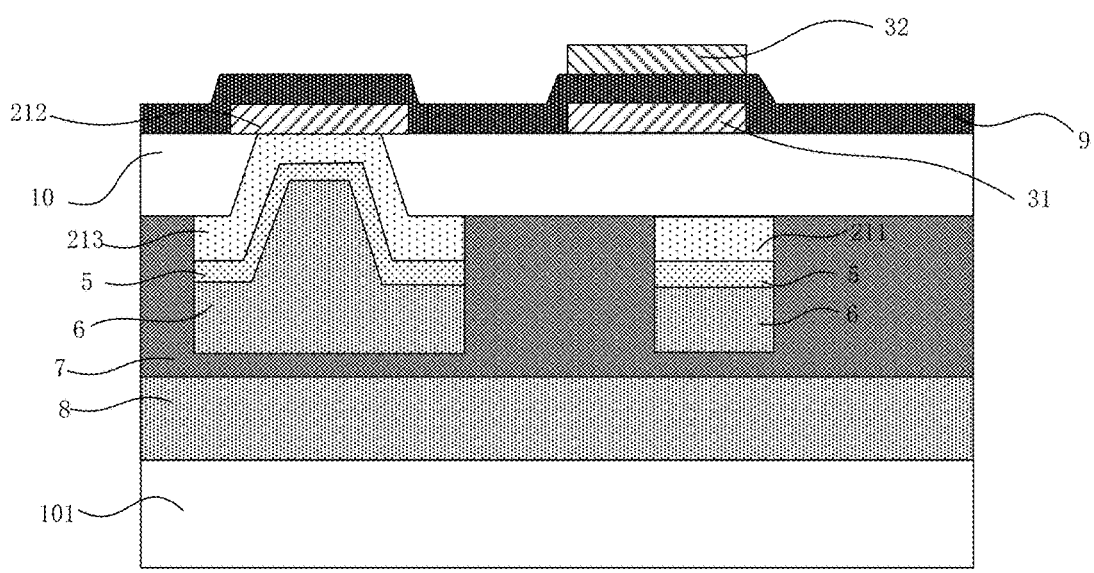
FIG. 4i is a schematic diagram of a structure formed by step S16 of a method for manufacturing a substrate integrated with a passive device according to the embodiments of the present disclosure.

At S16, the first interlayer dielectric layer 9 is formed on a side of the second sub-structure 212 of the induction coil and the first electrode plate 31 of the capacitor 3 away from the glass base 10, and a pattern including the second electrode plate 32 of the capacitor 3 is formed on a side of the first interlayer dielectric layer 9 away from the glass base 10, as shown in FIG. 4*i*.

In some examples, the first interlayer dielectric layer 9 is made of an inorganic insulating material. For example, the first interlayer dielectric layer 9 is an inorganic insulating layer made of silicon nitride (SiNx), or an inorganic insulating layer made of silicon oxide (e.g., $SiO_2$), or a laminated film of several inorganic insulating layers of SiNx and inorganic insulating layers of $SiO_2$. Apparently, the first interlayer dielectric layer 9 also serves as an intermediate dielectric layer of the capacitor 3.

In some examples, the second electrode plate 32 of the capacitor 3 may be formed by forming a third metal film layer by means of magnetron sputtering on the side of the first interlayer dielectric layer 9 away from the glass base 10, applying a photoresist, exposing, developing, performing wet etching, and stripping off the photoresist to form the pattern including the second electrode plate 32 of the capacitor 3.

Figure 4J:
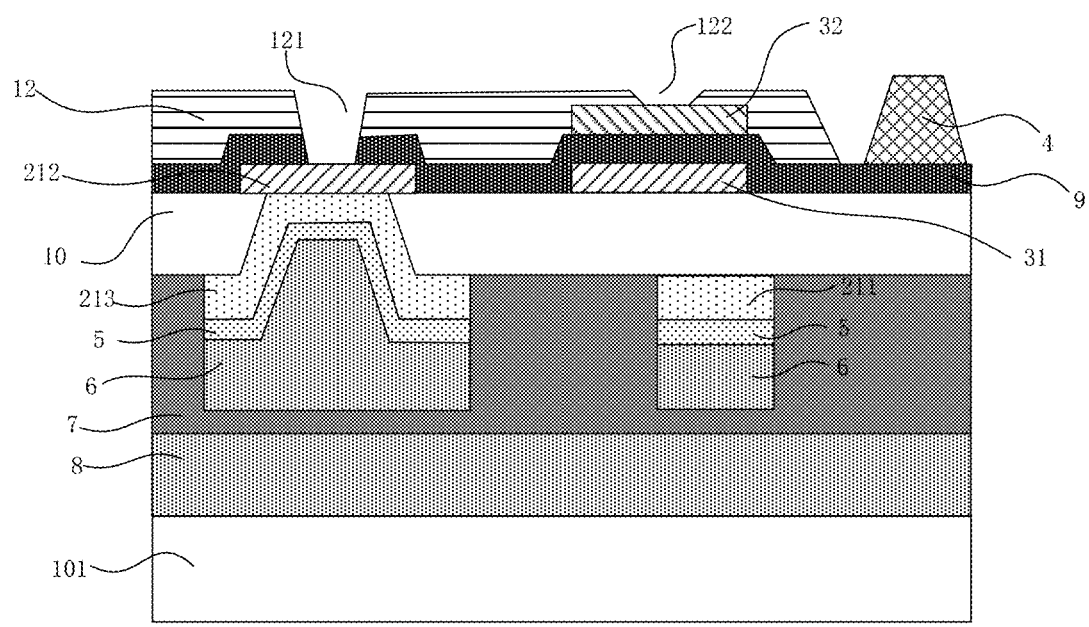
FIG. 4j is a schematic diagram of a structure formed by step S17 of a method for manufacturing a substrate integrated with a passive device according to the embodiments of the present disclosure.

At S17, the second interlayer dielectric layer 12 is formed on a side of the second electrode plate 32 of the capacitor 3 away from the glass base 10, and the second connection via 121 penetrating through the first interlayer dielectric layer and the second interlayer dielectric layer 12 is formed, and the third connection via 122 penetrating through the second interlayer dielectric layer 12 is also formed, as shown in FIG. 4j.

A material of the second interlayer dielectric layer 12 may be the same as that of the first interlayer dielectric layer 9, and thus is not repeated here.

Figure 4K:
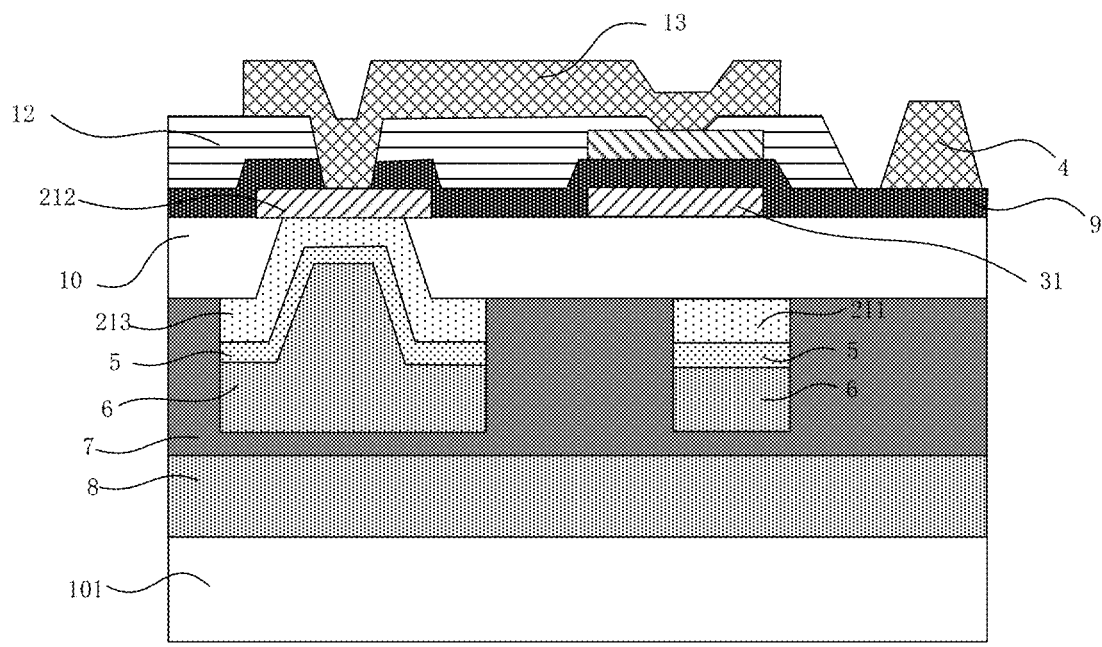
FIG. 4k is a schematic diagram of a structure formed by step S18 of a method for manufacturing a substrate integrated with a passive device according to the embodiments of the present disclosure.

At S18, a pattern including the second connection electrode 13 and the connection pad 4 is formed by a patterning process on a side of the second interlayer dielectric layer 12 away from the glass base 10, as shown in FIG. 4k.

In some examples, the step S18 may include forming a fourth metal film layer by means of magnetron sputtering, applying a photoresist, exposing, developing, performing wet etching, and stripping off the photoresist to form the pattern including the second connection electrode 13 and the connection pad 4. A material of the fourth metal film layer may be the same as that of the first metal film layer 201, and thus is not repeated here.

At S19, the first buffer layer 14 and the third planarization layer 15 are sequentially deposited on a side of a layer, where the second connection electrode 13 and the connection pad 4 are located, away from the glass base 10, and the first base substrate 101 is peeled off, as shown in FIG. 3.

In some examples, a material of the first buffer layer 14 may be the same as that of the first protective layer 5, and thus is not repeated here. A material of the third planarization layer 15 may be the same as that of the first planarization layer 6, and thus is not repeated here.

So far, fabrication of the substrate integrated with a passive device is completed.

In a second implementation, the method for manufacturing a substrate integrated with a passive device specifically includes the following steps S21 to S28.

Figure 5A:
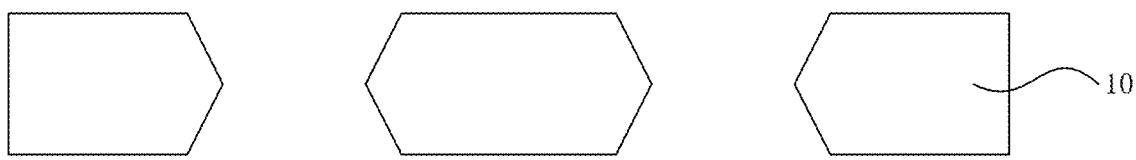
FIG. 5a is a schematic diagram of a structure formed by step S21 of a method for manufacturing a substrate integrated with a passive device according to the embodiments of the present disclosure.

At S21, the glass base 10 is provided, laser modification is performed on the first surface and the second surface of the glass base 10 respectively, and HF etching is performed to form the glass base 10 provided with the first connection vias 11, as shown in FIG. 5a.

In some examples, the step S21 may specifically include the following steps (1) to (3).

(1) Cleaning: the glass base 10 is cleaned in a cleaning machine.

In some examples, the glass base 10 has a thickness ranging from about 0.1 mm to 1.1 mm.

(2) Laser drilling: a laser is used to irradiate a laser beam vertically into the first surface of the glass base 10 to perform laser modification on the first surface so as to form a first sub-via in the first surface of the glass base 10, and similarly, the laser is used to irradiate a laser beam vertically into the second surface of the glass base 10 to perform laser modification on the second surface so as to form a second sub-via in the second surface of the glass base 10, with the second sub-via communicating with the first sub-via, thereby forming the first connection via 11.

Specifically, when the laser beam interacts with the glass base 10, atoms in the glass base 10 are ionized and ejected out of the first surface of the glass base 10 due to relatively high energy of laser photons, so that the hole drilled becomes deeper and deeper with time until the first sub-via is formed. Then the glass base 10 is turned over, and the second sub-via is formed according to a same principle. In general, laser wavelengths of 532 nm, 355 nm, 266 nm, 248 nm, and 197 nm may be selected, laser pulse widths ranging from ifs to 100 fs, from 1 ps to 100 ps, and from ins to 100 ns may be selected, and a type of the laser may be a continuous wave laser, a pulse laser or the like. The method of drilling the holes by the laser may include, but is not limited to, the following two modes. In a first mode, a diameter of a laser spot is relatively large, relative positions of the laser beam and the glass base 10 are fixed, and the hole with a preset depth is directly drilled in the glass base 10 due to the high energy of the laser beam, in such case, the first sub-via formed is in a shape of inverted frustum, and a diameter of the inverted frustum sequential decreases from top to bottom (along a direction from the second surface towards the first surface). In a second mode, the diameter of the laser spot is relatively small, the laser beam scans the glass base 10 in a manner of drawing circles, a focus of the laser spot is continuously changed, a focal depth of the focus is also continuously changed, and a spiral line is drawn from a lower surface (the first surface) of the glass base 10 towards an upper surface (the second surface) of the glass base 10, and a radius of the spiral line sequentially decreases from bottom to top, so that the glass base 10 is cut by the laser to form the first sub-via in a shape of frustum. The second sub-via is formed in a same way as the first sub-via, and thus formation of the second sub-via is not repeated here. It can be seen that the first connection via 11 formed by the first sub-via and the second sub-via communicating with each other has an hourglass shape.

(3) HF etching: in the laser drilling process, since a stress area ranging from about 5 microns to about 20 microns may be formed in a region of an upper surface of the glass base 10 close to the first connection via 11 and in a region of an inner wall of the first connection via 11, the surface of the glass base 10 in the stress area may be uneven and molten and has a plurality of burrs, and a large number of microcracks and macrocracks, and residual stress exist in the stress area, wet etching is carried out for a certain time duration by using an HF etching solution with a concentration ranging from 2% to 20% at a proper temperature, to remove a certain amount of glass in the stress area, so as to smoothen the surface of the glass base 10 in a region close to the first connection via 11 and the inner wall of the first connection via 11, eliminate the microcracks and the macrocracks, and remove the stress area completely.

At S22, the first connection electrode 213 in the first connection via 11 and the first sub-structure 211 are formed by a patterning process.

In some examples, the step S22 may specifically include the following steps (1) to (4).

Figure 5B:
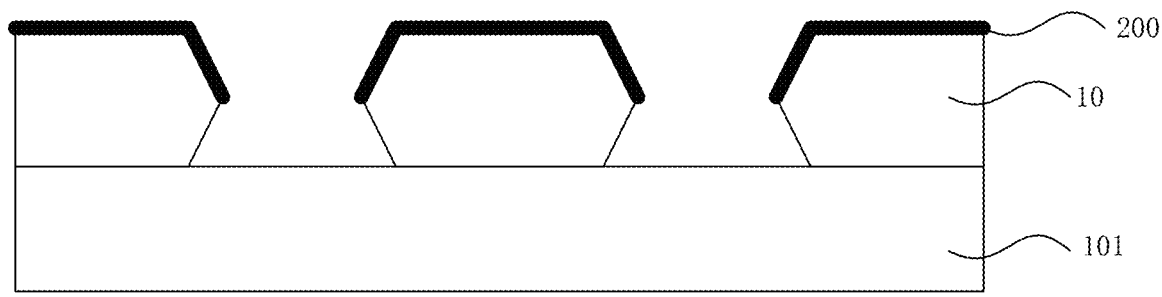
FIG. 5b and FIG. 5c are schematic diagrams of structures formed by (1) of step S22 of a method for manufacturing a substrate integrated with a passive device according to the embodiments of the present disclosure.
Figure 5C:
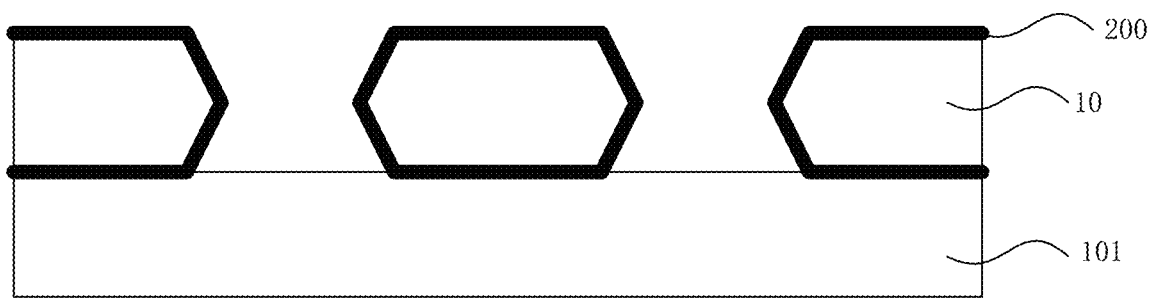

(1) Growing of a seed layer: a first base substrate 101 is provided, the first surface of the glass base 10 is attached to the first base substrate 101, a first metal material 200 is deposited on the second surface of the glass base 10 by means of magnetron sputtering, the glass base 10 is turned over, and the first metal material 200 is deposited on the first surface of the glass base 10 by means of magnetron sputtering, so that the first metal material 200 is formed on sidewalls of the first connection via 11 and serves as the seed layer, as shown in FIG. 5b and FIG. 5c.

In some examples, the first metal material 200 includes, but is not limited to, at least one of copper (Cu), aluminum (Al), molybdenum (Mo) or silver (Ag), and a thickness of the first metal material ranges from about 100 nm to about 500 nm, and further may range from about 50 nm to 35 μm. In the following description, a case where the first metal material 200 is copper for forming a first metal film layer 201 is taken as an example.

In some examples, in order to increase adhesion between the first metal material 200 and the surface of the glass base 10, an auxiliary metal film layer may be formed on the surface of the glass base 10 in a manner including, but not limited to, magnetron sputtering before the first metal material 200 is formed. A material of the auxiliary metal film layer includes, but is not limited to, at least one of nickel (Ni), molybdenum (Mo) alloy or titanium (Ti) alloy, for example, the auxiliary metal film layer may be made of MoNb, and the auxiliary metal film layer may have a thickness ranging from about 2 nm to about 20 nm.

Figure 5D:
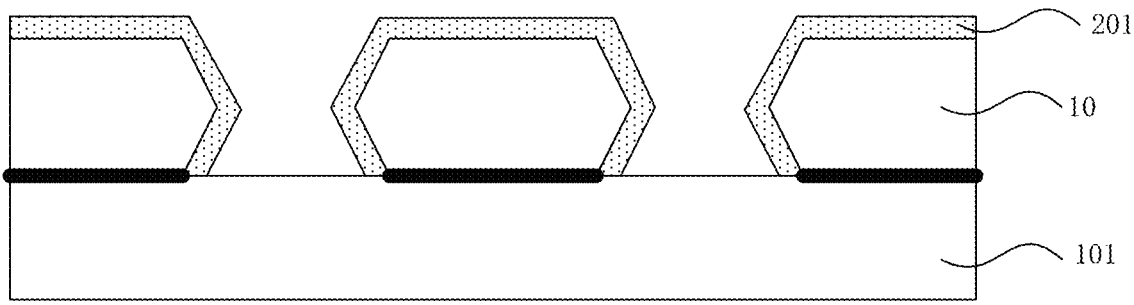
FIG. 5d is a schematic diagram of a structure formed by (2) of step S22 of a method for manufacturing a substrate integrated with a passive device according to the embodiments of the present disclosure.

(2) Electroplating: the glass base 10 is placed on a carrier of an electroplating machine, pressed by a powered pad, and placed in a hole-filling electroplating bath (containing a dedicated hole-filling electrolyte), a current is applied to keep the electroplating solution to flow on the surface of the glass base 10 continuously and rapidly, and cations in the electroplating solution near the inner wall of the first connection via 11 acquire electrons to form atoms to be deposited on the inner wall; and by using the dedicated hole-filling electrolyte with special proportion, copper can be mainly deposited in the first connection via at a high speed (a deposition speed ranging from 0.5 um/min to 3 um/min), while the surface of the glass base 10 is relatively flat, and the deposition speed of copper on such surface is extremely low (ranging from 0.005 um/min to 0.05 um/min). The copper on the inner wall of the first connection via becomes more and more thicker with time so as to form the first metal film layer 201, which outgrows the first metal material 200 by more than 5 m, and in such case, the first connection via 11 is not fully filled with the first metal film layer 201, as shown in FIG. 5d.

Figure 5E:
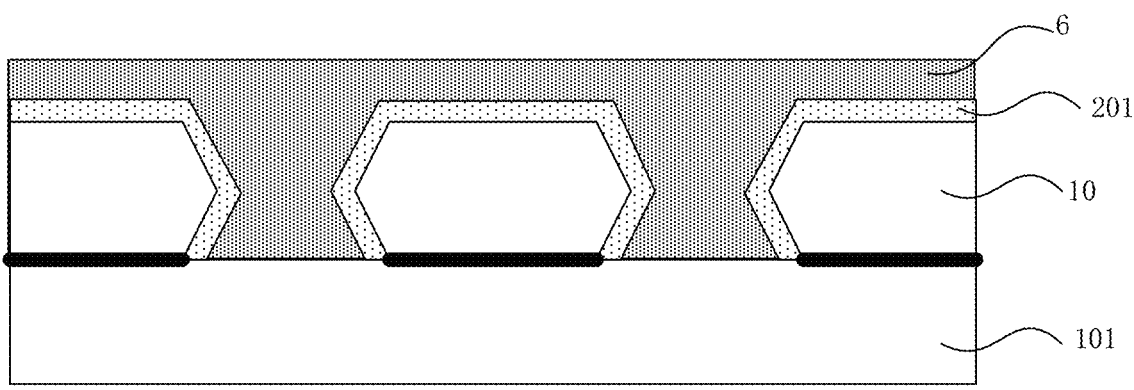
FIG. 5e is a schematic diagram of a structure formed by (3) of step S22 of a method for manufacturing a substrate integrated with a passive device according to the embodiments of the present disclosure.

(3) Formation of the first planarization layer 6: the first planarization layer 6 is formed on the glass base 10 to fully fill the first connection via 11, as shown in FIG. 5e. The first planarization layer 6 may be made of an organic insulating material, for example, the organic insulating material includes polyimide, epoxy resin, acrylic, polyester, photoresist, polyacrylate, polyamide, siloxane and other resin materials. As another example, the organic insulating material includes an elastic material, such as urethane, and Thermoplastic Polyurethane (TPU).

Figure 5F:
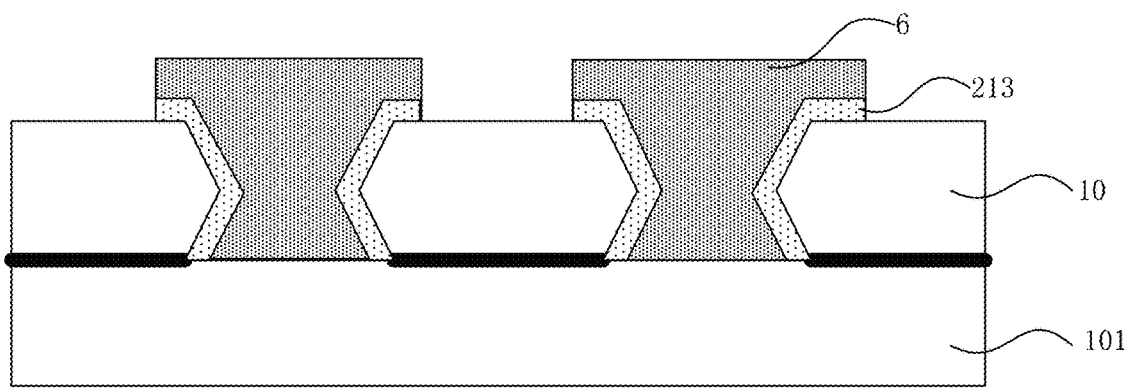
FIG. 5f is a schematic diagram of a structure formed by (4) of step S22 of a method for manufacturing a substrate integrated with a passive device according to the embodiments of the present disclosure.

(4) Patterning of layers on the first surface: the first planarization layer 6 on the first surface is exposed and developed, and then is etched, and a photoresist is stripped off after the etching, so that the first planarization layer 6 and the first metal film layer 201 on the first surface are patterned to form the first sub-structure 211 of the induction coil on the first surface, as shown in FIG. 5f.

Figure 5G:
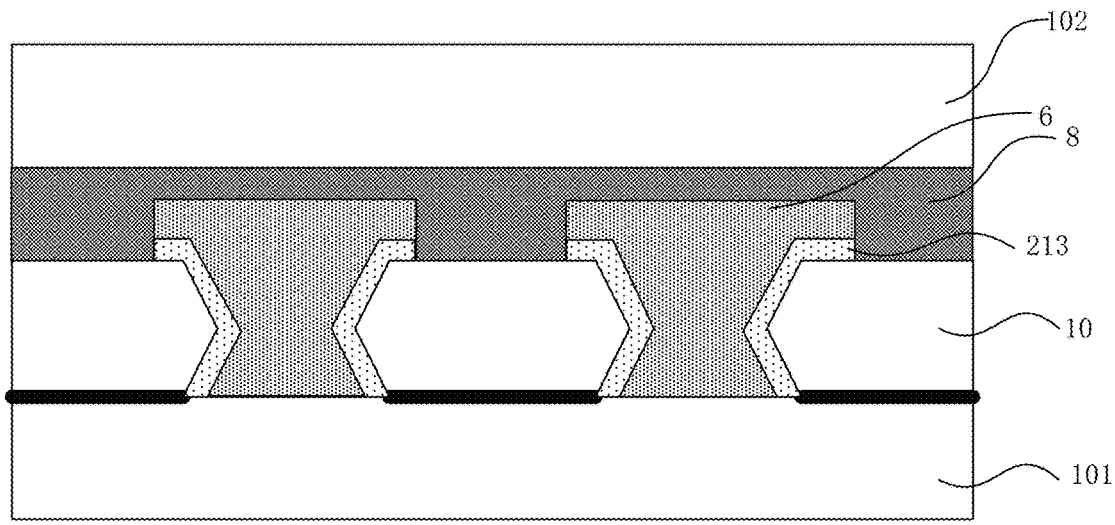
FIG. 5g is a schematic diagram of a structure formed by step S23 of a method for manufacturing a substrate integrated with a passive device according to the embodiments of the present disclosure.

At S23, the second planarization layer 8 is formed on a side of the first planarization layer 6 away from the glass base 10, and a second base substrate 102 is attached to a side of the second planarization layer 8 away from the glass base 10, as shown in FIG. 5g.

A material of the second planarization layer 8 may be the same as that of the first planarization layer 6, and thus is not repeated here.

Figure 5H:
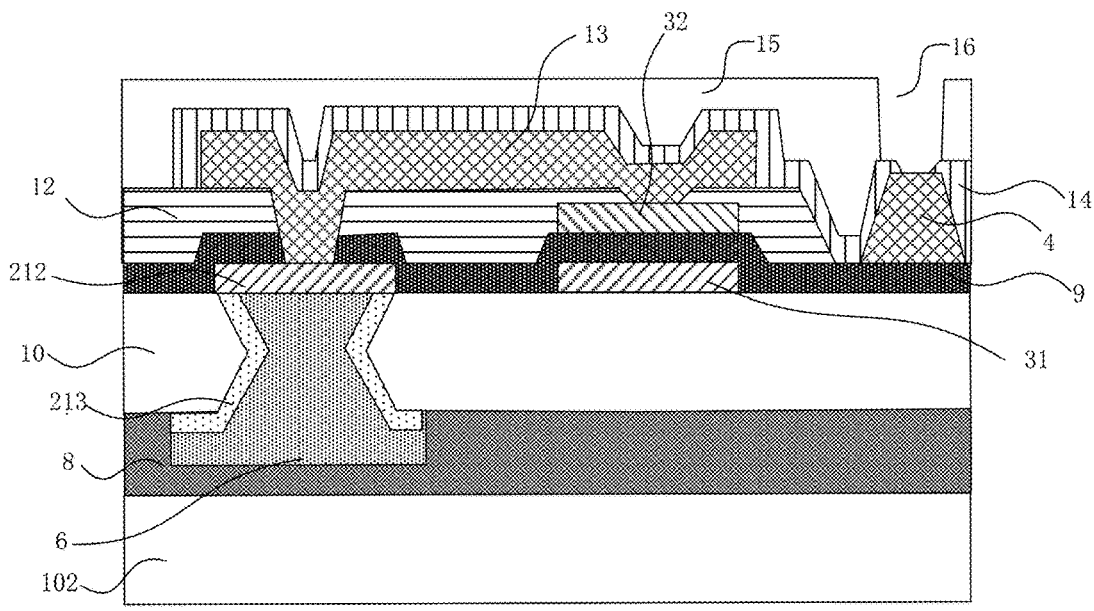
FIG. 5h is a schematic diagram of a structure formed by steps S24 to S27 of a method for manufacturing a substrate integrated with a passive device according to the embodiments of the present disclosure.

At S24, the glass base 10 is turned over, the first base substrate 101 is peeled off from the second surface of the glass base 10, and a pattern including the second sub-structure 212 of the induction coil and the first electrode plate 31 of the capacitor 3 is formed on the second surface of the glass base 10 by a patterning process, as shown in FIG. 5h.

In some examples, the step S24 may specifically include forming a second metal film layer in a manner including, but not limited to, magnetron sputtering, applying a photoresist, exposing, developing, performing wet etching, and stripping off the photoresist to form the pattern including the second sub-structure 212 of the induction coil and the first electrode plate 31 of the capacitor 3.

At S25, the first interlayer dielectric layer 9 is formed on a side of the second sub-structure 212 of the induction coil and the first electrode plate 31 of the capacitor 3 away from the glass base 10, and a pattern including the second electrode plate 32 of the capacitor 3 is formed on a side of the first interlayer dielectric layer 9 away from the glass base 10, as shown in FIG. 5h.

In some examples, the first interlayer dielectric layer 9 is made of an inorganic insulating material. For example, the first interlayer dielectric layer 9 is an inorganic insulating layer made of silicon nitride (SiNx), or an inorganic insulating layer made of silicon oxide (e.g., $SiO_2$), or a laminated film of several inorganic insulating layers of SiNx and inorganic insulating layers of $SiO_2$. Apparently, the first interlayer dielectric layer 9 also serves as an intermediate dielectric layer of the capacitor 3.

In some examples, the second electrode plate 32 of the capacitor 3 may be formed by forming a third metal film layer by means of magnetron sputtering on the side of the first interlayer dielectric layer 9 away from the glass base 10, applying a photoresist, exposing, developing, performing wet etching, and stripping off the photoresist to form the pattern including the second electrode plate 32 of the capacitor 3.

At S26, the second interlayer dielectric layer 12 is formed on a side of the second electrode plate 32 of the capacitor 3 away from the glass base 10, and the second connection via 121 penetrating through the first interlayer dielectric layer 9 and the second interlayer dielectric layer 12 is formed, and the third connection via 122 penetrating through the second interlayer dielectric layer 12 is also formed, as shown in FIG. 5h.

A material of the second interlayer dielectric layer 12 may be the same as that of the first interlayer dielectric layer 9, and thus is not repeated here.

At S27, a pattern including the second connection electrode 13 and the connection pad 4 is formed by a patterning process on a side of the second interlayer dielectric layer 12 away from the glass base 10, as shown in FIG. 5h.

In some examples, the step S27 may include forming a fourth metal film layer by means of magnetron sputtering, applying a photoresist, exposing, developing, performing wet etching, and stripping off the photoresist to form the pattern including the second connection electrode 13 and the connection pad 4. A material of the fourth metal film layer may be the same as that of the first metal film layer 201, and thus is not repeated here.

Figure 5I:
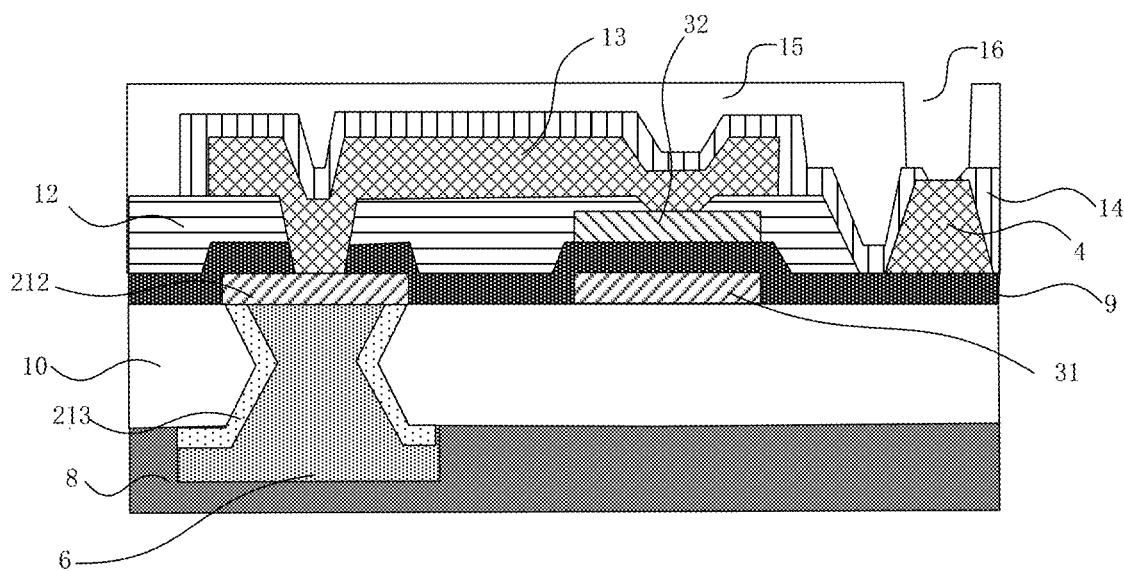
FIG. 5i is a schematic diagram of a structure formed by step S28 of a method for manufacturing a substrate integrated with a passive device according to the embodiments of the present disclosure.

At S28, the first buffer layer 14 and the third planarization layer 15 are sequentially deposited on a side of a layer, where the second connection electrode 13 and the connection pad 4 are located, away from the glass base 10, and the second base substrate 102 is peeled off, as shown in FIG. 5i.

In some examples, a material of the first buffer layer 14 may be the same as that of the first protective layer 5, and thus is not repeated here. A material of the third planarization layer 15 may be the same as that of the first planarization layer 6, and thus is not repeated here.

So far, fabrication of the substrate integrated with a passive device is completed.

Figure 6A:
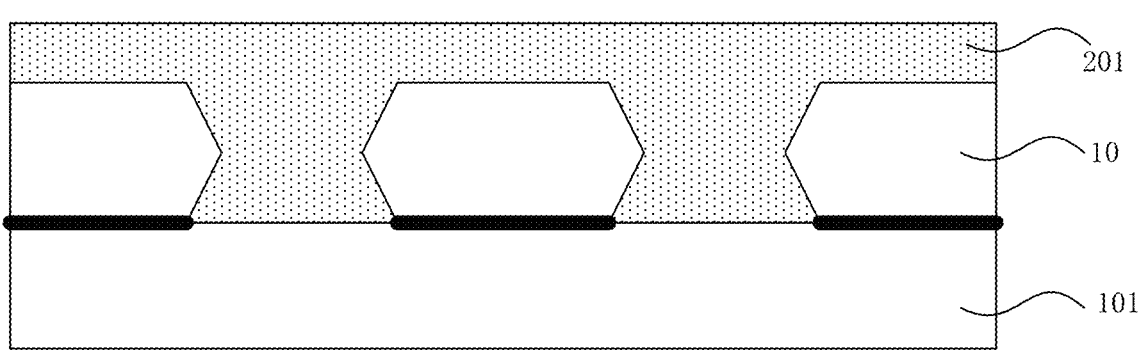
FIGS. 6a and 6b are schematic diagrams illustrating formation of a first connection electrode in a method for manufacturing a substrate integrated with a passive device according to the embodiments of the present disclosure.
Figure 6B:
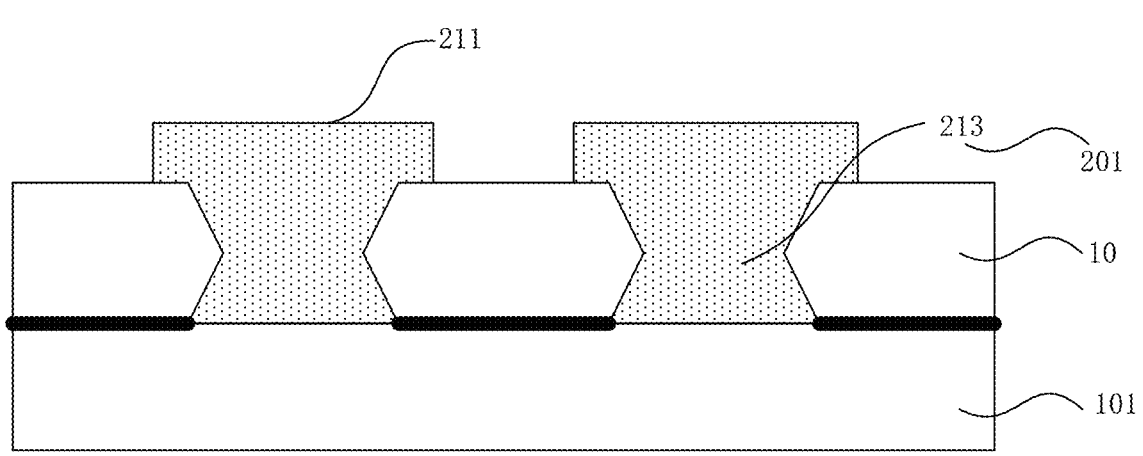

In a third implementation, the method for manufacturing a substrate integrated with a passive device is substantially the same as that in the second implementation, as shown in FIG. 6a and FIG. 6b, and is different from that in the second implementation in the step S22. In the third implementation, in the electroplating process of the step S22, the first connection electrode 213 is formed to fill the first connection via 11, which eliminates a need for forming the first planarization layer 6. All the other steps of the method in the third implementation are the same as those of the method in the second implementation, and thus are not repeated here.

It should be understood that the above implementations are merely exemplary implementations adopted to illustrate the principle of the present disclosure, and the present disclosure is not limited thereto. Various modifications and improvements can be made by those of ordinary sill in the art without departing from the spirit and essence of the present disclosure, and those modifications and improvements should considered within the scope of the present disclosure.

What is claimed is:

1. A method for manufacturing a substrate integrated with a passive device, comprising:
   providing and processing a transparent dielectric layer to obtain the transparent dielectric layer provided with a first connection via therein, with the transparent dielectric layer comprising a first surface and a second surface which are oppositely disposed along a thickness direction of the transparent dielectric layer; and
   integrating a passive device, which at least comprises an inductor, on the transparent dielectric layer;
   wherein the integrating a passive device on the transparent dielectric layer comprises:
   forming a first sub-structure on the first surface of the transparent dielectric layer, forming a second sub-structure on the second surface of the transparent dielectric layer, and forming a first connection electrode in the first connection via; and the first sub-structure, the first connection electrode and the second sub-structure are connected to form a coil structure of the inductor,
   the method comprises:
   providing the transparent dielectric layer, and etching the transparent dielectric layer to form a first blind hole;
   forming the first connection electrode in the first blind hole and the first sub-structure by a patterning process;
   performing a thinning process on a side of the transparent dielectric layer away from the first sub-structure to expose the first connection electrode and form the first connection via; and
   forming a pattern comprising the second sub-structure on the second surface of the transparent dielectric layer; and the second sub-structure, the first connection electrode and the first sub-structure are connected to form the coil structure of the inductor.

2. The method of claim 1, wherein the providing the transparent dielectric layer and etching the transparent dielectric layer to form a first blind hole comprises:
   performing laser modification and hydrofluoric acid (HF) etching on the transparent dielectric layer, to form the first blind hole.

3. The method of claim 1, wherein the forming the first connection electrode in the first blind hole and the first sub-structure by a patterning process comprises:
   forming a first metal material on the transparent dielectric layer provided with the first blind hole, and electroplating the first metal material to form a first metal film layer; and
   sequentially forming a first protective layer and a first planarization layer on a side of the first metal film layer away from the transparent dielectric layer, and forming a pattern comprising the first connection electrode and the first sub-structure by a patterning process.

4. The method of claim 1, comprising:
   providing a first base substrate, and attaching the transparent dielectric layer, which is provided with the first connection via, to the first base substrate;
   depositing a first metal material on the first surface and the second surface of the transparent dielectric layer respectively, and performing an electroplating process to allow the first metal material to cover at least a sidewall of the first connection via and form a first metal film layer on the first surface;
   patterning the first metal film layer to form a pattern comprising the first sub-structure; and
   forming a pattern comprising the second sub-structure on the second surface of the transparent dielectric layer; and the second sub-structure, the first connection electrode and the first sub-structure are connected to form the coil structure of the inductor.

5. The method of claim 4, wherein the providing a first base substrate and attaching the transparent dielectric layer to the first base substrate comprises:
   performing laser modification on the first surface and the second surface of the transparent dielectric layer respectively, and performing HF etching to form the first connection via.

6. The method of claim 4, wherein the first metal film layer covers a sidewall of the first connection via, and before forming the first metal film layer, the method further comprises:
   forming a first planarization layer on a side of the first metal material away from the transparent dielectric layer so as to fill the first connection via with the first planarization layer.

7. The method of claim 4, wherein after forming the first sub-structure, the method further comprises:
   sequentially forming a second protective layer and a second planarization layer on a side of the first sub-structure away from the transparent dielectric layer.

8. The method of claim 4, wherein the passive device further comprises a capacitor; a first electrode plate of the capacitor is further formed on the second surface with the second sub-structure being formed on the second surface; and the method further comprises:
   forming a first interlayer dielectric layer on a side of the first electrode plate of the capacitor away from the transparent dielectric layer;
   forming a second electrode plate of the capacitor on a side of the first interlayer dielectric layer away from the transparent dielectric layer;
   forming a second interlayer dielectric layer on a side of the second electrode plate of the capacitor away from the transparent dielectric layer, and forming a second connection via penetrating through the first interlayer dielectric layer and the second interlayer dielectric layer and a third connection via penetrating through the second interlayer dielectric layer; and forming a pattern comprising a second connection electrode and a connection pad by a patterning process on a side of the second interlayer dielectric layer away from the transparent dielectric layer; and the second connection electrode connects the second sub-structure to the second electrode plate of the capacitor through the second connection via and the third connection via.

9. The method of claim 8, wherein a first buffer layer and a third planarization layer are sequentially deposited on a side of a layer, where the second connection electrode and the connection pad are located, away from the transparent dielectric layer, and a fourth connection via penetrating through the first buffer layer and the third planarization layer is formed, and exposes the connection pad.

10. The method of claim 1, wherein after forming the first sub-structure, the method further comprises:

sequentially forming a second protective layer and a second planarization layer on a side of the first sub-structure away from the transparent dielectric layer.

11. The method of claim 1, wherein the passive device further comprises a capacitor; a first electrode plate of the capacitor is further formed on the second surface with the second sub-structure being formed on the second surface; and the method further comprises:

forming a first interlayer dielectric layer on a side of the first electrode plate of the capacitor away from the transparent dielectric layer;

forming a second electrode plate of the capacitor on a side of the first interlayer dielectric layer away from the transparent dielectric layer;

forming a second interlayer dielectric layer on a side of the second electrode plate of the capacitor away from the transparent dielectric layer, and forming a second connection via penetrating through the first interlayer dielectric layer and the second interlayer dielectric layer and a third connection via penetrating through the second interlayer dielectric layer; and forming a pattern comprising a second connection electrode and a connection pad by a patterning process on a side of the second interlayer dielectric layer away from the transparent dielectric layer; and the second connection electrode connects the second sub-structure to the second electrode plate of the capacitor through the second connection via and the third connection via.

12. The method of claim 11, wherein a first buffer layer and a third planarization layer are sequentially deposited on a side of a layer, where the second connection electrode and the connection pad are located, away from the transparent dielectric layer, and a fourth connection via penetrating through the first buffer layer and the third planarization layer is formed, and exposes the connection pad.

13. The method of claim 1, wherein the transparent dielectric layer comprises a glass base.

14. A substrate integrated with a passive device, comprising: a transparent dielectric layer and a passive device integrated on the transparent dielectric layer;

wherein the transparent dielectric layer comprises a first surface and a second surface, which are disposed oppositely along a thickness direction of the transparent dielectric layer; and the transparent dielectric layer is provided with a first connection via penetrating through the transparent dielectric layer along the thickness direction of the transparent dielectric layer; and the passive device comprises at least an inductor; the inductor comprises a first sub-structure on the first surface, a second sub-structure on the second surface, and a first connection electrode in the first connection via for sequentially connecting the first sub-electrode with the second sub-structure in series, wherein the passive device further comprises a capacitor; a first electrode plate of the capacitor and the second sub-structure of the inductor are in a same layer; the substrate further comprises a first interlayer dielectric layer on a side of the first electrode plate of the capacitor away from the transparent dielectric layer; and a second electrode plate of the capacitor is on a side of the first interlayer dielectric layer away from the first electrode plate of the capacitor.

15. The substrate of claim 14, wherein the transparent dielectric layer comprises a glass base.

16. A method for manufacturing a substrate integrated with a passive device, comprising:

providing and processing a transparent dielectric layer to obtain the transparent dielectric layer provided with a first connection via therein, with the transparent dielectric layer comprising a first surface and a second surface which are oppositely disposed along a thickness direction of the transparent dielectric layer; and integrating a passive device, which at least comprises an inductor, on the transparent dielectric layer;

wherein the integrating a passive device on the transparent dielectric layer comprises:

forming a first sub-structure on the first surface of the transparent dielectric layer, forming a second sub-structure on the second surface of the transparent dielectric layer, and forming a first connection electrode in the first connection via; and the first sub-structure, the first connection electrode and the second sub-structure are connected to form a coil structure of the inductor, wherein the passive device further comprises a capacitor; a first electrode plate of the capacitor is further formed on the second surface with the second sub-structure being formed on the second surface; and the method further comprises:

forming a first interlayer dielectric layer on a side of the first electrode plate of the capacitor away from the transparent dielectric layer;

forming a second electrode plate of the capacitor on a side of the first interlayer dielectric layer away from the transparent dielectric layer;

forming a second interlayer dielectric layer on a side of the second electrode plate of the capacitor away from the transparent dielectric layer, and forming a second connection via penetrating through the first interlayer dielectric layer and the second interlayer dielectric layer and a third connection via penetrating through the second interlayer dielectric layer; and forming a pattern comprising a second connection electrode and a connection pad by a patterning process on a side of the second interlayer dielectric layer away from the transparent dielectric layer; and the second connection electrode connects the second sub-structure to the second electrode plate of the capacitor through the second connection via and the third connection via.

* * * * *